United States Patent
Kadijk et al.

(10) Patent No.: US 10,591,151 B2
(45) Date of Patent: Mar. 17, 2020

(54) LIGHT EMITTING DEVICE

(71) Applicant: SIGNIFY HOLDING B.V., Eindhoven (NL)

(72) Inventors: Simon Eme Kadijk, Veldhoven (NL); Tewe Hiepke Heemstra, Veldhoven (NL); Vincent Stefan David Gielen, Gastel (NL); Edwin Petronella Helena Van Lier, Neer (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/462,522

(22) PCT Filed: Nov. 23, 2017

(86) PCT No.: PCT/EP2017/080223
§ 371 (c)(1),
(2) Date: May 20, 2019

(87) PCT Pub. No.: WO2018/099801
PCT Pub. Date: Jun. 7, 2018

(65) Prior Publication Data
US 2019/0346125 A1    Nov. 14, 2019

(30) Foreign Application Priority Data

Dec. 1, 2016  (EP) ..................................... 16201698
Sep. 5, 2017  (EP) ..................................... 17189494

(51) Int. Cl.
*F21V 29/502*  (2015.01)
*F21V 29/71*  (2015.01)
(Continued)

(52) U.S. Cl.
CPC .......... *F21V 29/502* (2015.01); *F21V 29/717* (2015.01); *G02B 6/0028* (2013.01); *G02B 6/0068* (2013.01); *F21Y 2115/10* (2016.08)

(58) Field of Classification Search
CPC ...... F21V 29/502; F21V 29/717; F21V 29/02; F21V 29/002; F21V 29/06; F21V 29/20;
(Continued)

(56) References Cited

U.S. PATENT DOCUMENTS

| 2011/0121703 A1 | 5/2011 | Karlicek, Jr. et al. |
| 2011/0268888 A1 | 11/2011 | Middlemass et al. |
| 2018/0173002 A1* | 6/2018 | Bruls .................. G02B 6/0003 |

FOREIGN PATENT DOCUMENTS

| DE | 102013206338 A1 | 10/2014 |
| GB | 2468411 A | 9/2010 |

(Continued)

*Primary Examiner* — Joseph L Williams
*Assistant Examiner* — Jose M Diaz
(74) *Attorney, Agent, or Firm* — Daniel J. Piotrowski (57) ABSTRACT

A light emitting device (1) comprising a luminescent element (2) comprising a first surface (21), at least one cooling element (3) arranged at the first surface of the luminescent element, and a plurality of spacer elements (5) arranged between the cooling element (3) and the first surface (21) of the luminescent element such that the cooling element is arranged spaced apart from the first surface of the luminescent element with a distance, d. The at least one cooling element (3) comprises a compliance such as to be adapted for following warpage of the luminescent element (2) induced by any one or more of clamping forces, forces inflicted by production processes and light and/or heat propagating within the luminescent element, and a force (F) is applied to force the at least one cooling element (3) and the luminescent element (2) together in such a way that no part of the at least one cooling element and the luminescent element are in direct mutual contact.

15 Claims, 5 Drawing Sheets

(51) Int. Cl.
*F21V 8/00* (2006.01)
*F21Y 115/10* (2016.01)

(58) Field of Classification Search
CPC ....... F21V 29/70; F21V 29/71; G02B 6/0028; G02B 6/0068; F21Y 2115/10
See application file for complete search history.

(56) References Cited

FOREIGN PATENT DOCUMENTS

| | | |
|---|---|---|
| WO | 2008087572 A1 | 7/2008 |
| WO | 2014202726 A1 | 12/2014 |
| WO | 2015091081 A1 | 6/2015 |
| WO | 2016012146 A1 | 1/2016 |

* cited by examiner

LIGHT EMITTING DEVICE

CROSS-REFERENCE TO PRIOR APPLICATIONS

This application is the U.S. National Phase application under 35 U.S.C. § 371 of International Application No. PCT/EP2017/080223, filed on Nov. 23, 2017 which claims the benefit of European Patent Application No. 17189494.2, filed on Sep. 5, 2017 and European Patent Application No. 16201698.4, filed on Dec. 1, 2016. These applications are hereby incorporated by reference herein.

FIELD OF THE INVENTION

The invention concerns a light emitting device comprising a luminescent element comprising a first surface, at least one cooling element arranged at the first surface of the luminescent element, and a plurality of spacer elements arranged between the cooling element and the first surface of the luminescent element such that the cooling element is arranged spaced apart from the first surface of the luminescent element with a distance d.

BACKGROUND OF THE INVENTION

Polished, elongated rectangular luminescent elements being irradiated by blue light from LEDs are well known within the field of light emitting devices. Within such a luminescent element, the blue light is converted into green or red light. Photons within a certain directional cone will experience total internal reflection (TIR) by the sides of the luminescent element, and will propagate to the exit window (or to a mirror on the surface opposite to the exit window) and can be used for a desired imaging or lighting purpose.

The conversion of the blue light into light of longer wavelengths is, due to Stokes shift, associated with heat generation. The heat has to be transported out of the luminescent element while maintaining the TIR for the light. This can be performed by maintaining a small, but nonzero distance between the TIR surface and a surface of a cooling plate.

WO 2014/202726 A1 describes a light emitting device comprising a transparent heat sink element and a luminescent light guide. In connection with one embodiment it is mentioned that a gap may be provided between the transparent heat sink element and the luminescent light guide. The gap may have a size of e.g. less than 200 µm, less than 100 µm or less than 50 µm. The gap may be an air gap maintained by means of spacer elements, or it may be partially or completely filled with an optically transparent and thermally non-transparent material such as an optically transparent adhesive with a relatively low thermal conductivity.

However, as the distance between the luminescent element and the cooling element contributes something like 50% of the total thermal resistance, the magnitude of the distance is critical. In particular, it is important that the distance between the luminescent element and the cooling element is large enough that the evanescent wave created in connection with the TIR does not cause light losses towards the cooling plate, yet not too large as it will then contribute too much to the thermal resistance. Maintaining this correct distance in an industrial environment has turned out to be a challenging task.

SUMMARY OF THE INVENTION

It is an object of the present invention to overcome this problem, and to provide a light emitting device with a luminescent element and a cooling element, where the distance between the luminescent element and the cooling element is kept large enough that the evanescent wave created in connection with the TIR does not cause light losses towards the cooling plate, yet not too large as it will then contribute too much to the thermal resistance.

A further object is to provide such a light emitting device with which maintaining this correct distance in an industrial environment is made possible.

According to a first aspect of the invention, this and other objects are achieved by means of a light emitting device comprising a luminescent element comprising a first surface, at least one cooling element arranged at the first surface of the luminescent element, and a plurality of spacer elements arranged between the cooling element and the first surface of the luminescent element such that the cooling element is arranged spaced apart from the first surface of the luminescent element with a distance d, where the at least one cooling element comprises a compliance such as to be adapted for following warpage of the luminescent element, and where a force is applied to force the at least one cooling element and the luminescent element together in such a way that no part of the at least one cooling element and the luminescent element are in direct mutual contact.

By providing a light emitting device with at least one cooling element comprising a compliance such as to be adapted for following warpage of the luminescent element, a light emitting device is provided with which the distance between the luminescent element and the cooling element may at all times be kept large enough that the evanescent wave created in connection with the TIR does not cause light losses towards the cooling plate.

By applying a force to force the at least one cooling element and the luminescent element together in such a way that no part of the at least one cooling element and the luminescent element are in direct mutual contact, a light emitting device is provided with which the distance between the luminescent element and the cooling element may at all times also be kept limited such that it will not contribute too much to the thermal resistance. Thereby the cooling effect is not compromised.

As used herein the term "compliance" is intended to mean the property of a material of undergoing elastic deformation when subjected to an applied force, or in other words the reciprocal of stiffness.

As used herein the term "direct mutual contact" is intended to mean physical contact between two elements without any additional elements between said two elements.

In an embodiment the at least one cooling element and the luminescent element are forced together by a force applied in such a way that no part of the at least one cooling element and the luminescent element are in direct mutual contact.

In an embodiment the force forcing the cooling element and the luminescent element together is a predetermined force and/or the force forcing the luminescent element together is or is kept constant or substantially constant over time.

In an embodiment the at least one cooling element comprising a compliance such as to be adapted for following warpage of the luminescent element in such a way that no part of the at least one cooling element and the luminescent element are in direct mutual contact.

The warpage of the luminescent element may for instance be induced by any one or more of clamping forces, forces inflicted during production processes and light and/or heat propagating within the luminescent element.

Furthermore, with such a light emitting device maintenance of this correct distance in an industrial environment is made possible, and is even simple to achieve.

In an embodiment only a part of the at least one cooling element facing the luminescent element comprises the compliance such that the cooling element is adapted for following warpage of the luminescent element induced by light and/or heat propagating within the luminescent element, especially in such a way that no part of the at least one cooling element and the luminescent element are in mutual contact.

Thereby a light emitting device is provided which has a simpler and more robust structure as other parts of the cooling element may be made of a more durable material and/or with a sturdier structure.

In an embodiment the plurality of spacer elements is one of surface structures provided on the at least one cooling element and separate spacer elements.

Spacer elements in the form of surface structures provide for a light emitting device comprising fewer components thus being less expensive in production. Such surface structures may in an embodiment be provided in a simple and inexpensive manner by indenting the surface of the cooling element in such a way that the correct and desired size and shape of surface structures in the form of protrusions forming the spacer elements appear. Such surface structures also have the advantage of inherently being compatible with the range of temperatures prevailing in the light emitting device at the position of the spacer elements when light and/or heat propagates through the luminescent element and heat is conducted towards the cooling element. Also, an elongated shape will absorb more light while likely being able to resist high forces. Spacer elements in the form of separate elements, on the other hand, have the advantage of allowing choice of a wider range of materials and types of spacer elements, whereby more factors such as reflectivity and heat transmissivity may be taken into account.

In an embodiment the plurality of spacer elements are beads in the form of nanospheres.

Nanospheres have the advantage of being particularly simple to apply to the surface of the luminescent element, thus providing for a light emitting device being simple to produce. Nanospheres also provide a good compromise between the mechanical and optical/light loss function as the area parallel to the surface is minimized while maintaining a stable position.

In an embodiment the nanospheres are silica nanospheres, monodisperse silica nanospheres or silver coated nanospheres.

$Al_2O_3$ and $TiO_2$ nanospheres are available in accurate dimensions commercially. These materials are white, which at high spacer density might be somewhat advantageous. Other materials may also be suitable.

These types of nanospheres have the advantage of being compatible with the range of temperatures prevailing in the light emitting device at the position of the spacer elements when light and/or heat propagates through the luminescent element and heat is conducted towards the cooling element. Silver coated nanospheres have the further advantage of reflecting a high amount of light and therefore allowing the use of a higher density of spacer elements. Also, for silver coated nanospheres, an optional protective layer, e.g. of $SiO_2$, may be added to prevent blackening, which may otherwise occur due to the presence of $H_2S$ in air.

In an embodiment the minimal density of the plurality of spacer elements is chosen in dependence of the compliance of the at least one cooling element in such a way that no part of the at least one cooling element and the luminescent element are in mutual contact.

Thereby maintenance of the correct distance both generally and in an industrial environment is ensured while taking into account the nature of the material and/or structure of the cooling element.

In an embodiment the maximal density of the plurality of spacer elements is chosen in dependence of the amount of light loss inflicted by the spacer elements.

Thereby maintenance of the correct distance both generally and in an industrial environment is ensured while limiting the number of spacer elements, while also minimizing light losses caused by the spacer elements and thus maintaining a high efficiency of the light emitting device.

In an embodiment the spacer elements are distributed regularly over the first surface of the luminescent element.

Thereby maintenance of not only the correct distance but also a uniform distance over the area of the first surface of the luminescent element both generally and in an industrial environment is ensured, while also enabling optimizing the number of spacer elements used.

In an embodiment the spacer elements are provided on the cooling element by means of wet-spraying, semi-wet-spraying, dry-spraying, wet etching, dry etching or anodizing followed by laser ablation or engraving. Thereby a uniform or regular distribution of the spacer elements may be obtained by a well-proven and thus simple to employ process. Anodizing followed by laser ablation or engraving furthermore provides for an improved surface roughness obtaining a particularly good trade-off between ensuring an optimal thermal contact and avoiding optical contact between cooling element and luminescent element.

In an embodiment the distance, d, with which the cooling element is arranged spaced apart from the first surface of the luminescent element is uniform over the extension of the first surface of the luminescent element.

A uniform distance is generally the best compromise between light loss and thermal resistance. Only if the light intensity and/or the temperature and/or the thermal resistance to ambient vary significantly versus position, it might be advantageous to have some gradient of the distance d over position.

In an embodiment the distance, d, with which the cooling element is arranged spaced apart from the first surface of the luminescent element is more than 1 µm and less than 10 µm.

A distance between the luminescent element and the cooling element of a few µm has been shown to be large enough that the evanescent wave created in connection with the TIR does not cause too much light losses towards the cooling plate. A distance between the luminescent element and the cooling element of less than the current technical feasible distance of (est.) 6 µm will improve the currently feasible thermal resistance. Thus, a distance between the luminescent element and the cooling element of between 1 µm and 10 µm has been shown to provide an optimum tradeoff between the two above mentioned effects. The actual value will be a careful tradeoff between a number of factors, and is expected to be e.g. 1.5-1.75 µm (or approximately 3 wavelengths of the longest relevant wavelength) but maybe lower. However, at too low distance, especially the long wavelengths will attenuate more than the short ones, this could give some non-uniformity of the image. At still shorter gaps, the light loss itself will be considerable. At too low distance, the cost for making both surfaces flat enough on the relevant distance scale could go up. E.g. clean rooms and associated procedures could be necessary, at this moment dirt could be a relevant factor influencing gap thickness. And at too high distance, there is no advantage above the current 6 μm (with considerable spread), in which the gap is about half of the total thermal resistance.

In light of the above, in an embodiment the distance, d, with which the cooling element is arranged spaced apart from the first surface of the luminescent element is therefore more than 1 μm and less than 5 μm, which corresponds to 2-3 times the wavelength of the light emitted by the light emitting device.

In an embodiment the at least one cooling element is a hollow cooling element comprising walls adapted to provide the compliance of the cooling element, the hollow cooling element being filled with a fluid, the fluid being under a pressure such as to provide the force applied to force the at least one cooling element and the luminescent element together.

Thereby a light emitting device with a cooling element having a simple and durable structure with which the force on the wall of the cooling element resulting from the fluid being under pressure presses the cooling element smoothly towards the luminescent element, thus keeping the distance d uniform over the whole area of the first surface of the luminescent element.

In an embodiment the at least one cooling element is a cooling element comprising slits or fins, the number and density of the slits or fins being chosen such as to provide the compliance of the cooling element.

Thereby a light emitting device with a cooling element having a particularly simple and durable structure is provided, the slits or fins providing the necessary compliance to ensure that the force applied presses the cooling element smoothly towards the luminescent element, thus keeping the distance d uniform over the whole area of the first surface of the luminescent element.

In an embodiment the light emitting device further comprises a force application device adapted for applying the force applied to force the at least one cooling element and the luminescent element together.

Such a force application device, may for instance be a clamp or a spring-biased device holding the light emitting device. Thereby the force applied to the luminescent element and the cooling element is provided in a particularly simple and straight forward manner.

In an embodiment the light emitting device comprises a further cooling element arranged at a second surface of the luminescent element opposite to the first surface of the luminescent element, and a further plurality of spacer elements arranged between the further cooling element and the second surface of the luminescent element such that the further cooling element is arranged spaced apart from the second surface of the luminescent element with a distance d', the further cooling element comprising a compliance such as to be adapted for following warpage of the luminescent element, and a force being applied to force the further cooling element and the luminescent element together in such a way that no part of the at least one cooling element and the luminescent element are in direct mutual contact.

In a further embodiment the further cooling element comprises a compliance such as to be adapted for following warpage of the luminescent element in such a way that no part of the further cooling element and the luminescent element are in direct mutual contact.

Thereby further cooling effect is provided to the light emitting device, while still achieving the above-mentioned and other objects. It is noted that it is also possible to provide the light emitting device with more than two cooling elements for even further improved cooling effect.

In a further embodiment, the light emitting device further comprises a plurality of LEDs adapted for, in operation, emitting first light with a first spectral distribution, and being arranged at or on a light input surface of the luminescent element, the luminescent element being adapted for receiving the first light with the first spectral distribution at the light input surface, converting at least a part of the first light with the first spectral distribution to second light with a second spectral distribution, guiding the second light to a light exit surface and coupling the second light with the second spectral distribution out of the light exit surface.

The invention further concerns a lighting device or a luminaire with a light emitting device according to the invention.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
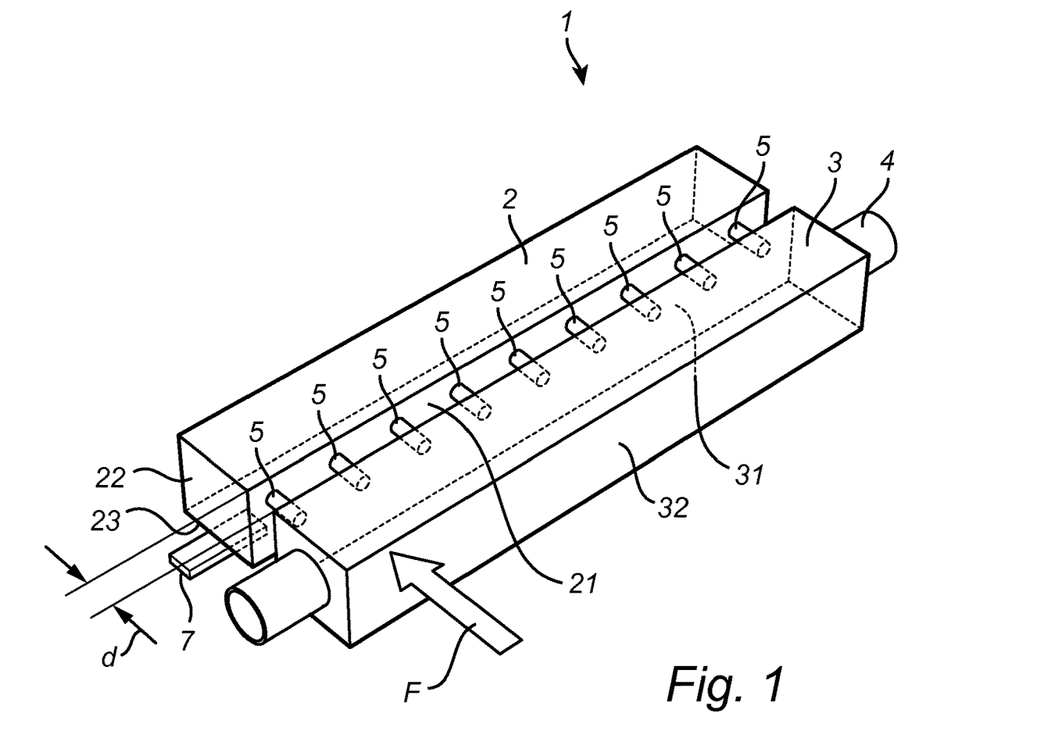
FIG. 1 shows a perspective view of a first embodiment of a light emitting device according to the invention and comprising a luminescent element and one cooling element.

FIG. 1 shows a perspective view of a first embodiment of a light emitting device 1 according to the invention. The light emitting device 1 comprises a luminescent element 2 with a first surface 21 and a cooling element 3 arranged at the first surface 21 of the luminescent element 2.

The luminescent element 2 is in the embodiment shown a polished, elongated rectangular rod. Other shapes of the luminescent element 2 is, however, also feasible. The luminescent element 2 is irradiated by blue light from LEDs. In FIG. 1 such an LED 7 is shown schematically as being arranged adjacent to a lower surface 23 of the luminescent element 2, however, without being limited to this position. Within the luminescent element 2, the blue light is converted into green or red light. Light within a certain directional cone will experience total internal reflection (TIR) by the surfaces, e.g. the first surface 21 or the opposite second surface 22, of the luminescent element 2, and will propagate to the exit window of the luminescent element 2 (or to a mirror arranged on the surface opposite to the exit window) and can be used for a desired application, such as the image formation of a beamer.

The conversion of the blue light into light of longer wavelengths is, due to Stokes shift, associated with heat generation. The heat has to be transported out of the luminescent element 2 to the cooling element 3 at the first surface 21 while maintaining the total internal reflection (TIR) for the light at the first surface 21. This can be performed by maintaining a small, but nonzero distance, d, between the first surface 21 and a surface 31 of the cooling plate 3 facing the luminescent element 2.

Therefore, a plurality of spacer elements 5 is provided and arranged between the surface 31 of the cooling element 3 and the first surface 21 of the luminescent element 2 such that the cooling element 3 is arranged spaced apart from the first surface 21 of the luminescent element 2 with the distance, d.

More generally, to keep the two surfaces in a well-controlled mutual distance from one another, the distance should be controlled at least at three points that are not on a straight line, or alternative measures that keep the planes parallel in a different way should be taken. Therefore, other embodiments include two rows of spacer elements 5 or arranging the spacer elements in a zig-zag formation as shown on FIG. 2, in which half of the spacer elements 5' are displaced from the remaining spacer elements 5'.

The at least one cooling element 3 is compliant, and is therefore adapted for following the actual warpage of the luminescent element 2, and in particular the warpage induced in the luminescent element 2 by any one or more of clamping forces, forces inflicted during production processes and light and/or heat propagating within the luminescent element 2. Thereby no part of the cooling element 3 and the luminescent element 2 are in mutual contact at any time. Furthermore, a force, F, indicated by means of arrows in FIG. 1 is applied to the light emitting device 1 in such a direction that the at least one cooling element 3 and the luminescent element 2 are forced together.

In the embodiment shown in FIG. 1 the force F is obtained by providing the cooling element 3 as a cooling element or cooling plate in the form of a fluid container 3 with thin walls 31, 32 and comprising a heat pipe 4. The medium within the fluid container 3 is under a predetermined pressure creating an outwards directed force F. The resulting force F on the wall 31 presses the wall 31 smoothly against the luminescent rod 2.

In practice the medium in a heat pipe is (within bounds) in pressure equilibrium with the coolest fluid in the heat pipe. Therefore, at startup the pressure is very low and there is not a good thermal contact. During heat-up the thermal contact may come too late and the rod may already be overheated and broken by thermal stress before the thermal contact arrives. Therefore, to obtain the predetermined pressure needed to create the outwards directed force F, the cooling element 3 is provided with a pressurized fluid, a pump, and an external radiator. The cooling power may be about 20 W. A suitable such system could be made resembling the well-known water cooling systems for computer CPU's, possibly with improved pressure control; e.g. in the form of a suitable bellows or the like.

Figure 2:
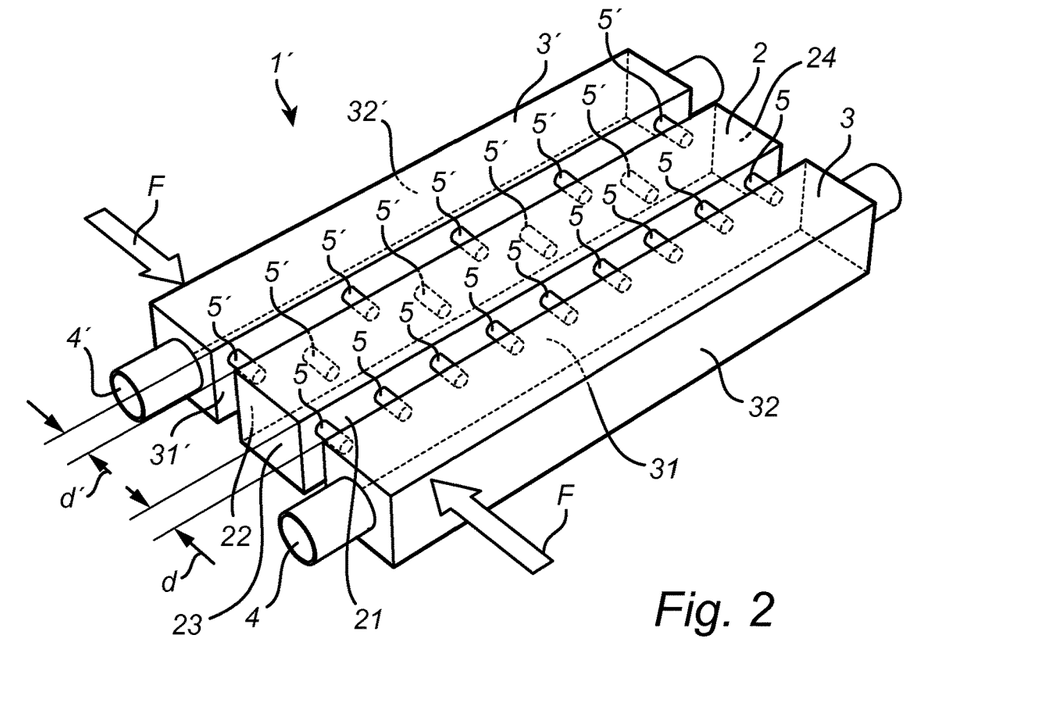
FIG. 2 shows a perspective view of the light emitting device according to FIG. 1 and comprising two cooling elements arranged at mutually opposite surfaces of the luminescent element.

FIG. 2 shows a perspective view of a light emitting device 1', which differs from the light emitting device 1 according to FIG. 1 only in comprising two cooling elements 3 and 3' arranged at mutually opposite surfaces 21 and 22 of the luminescent element 2 as well as two pluralities of spacer elements 5 and 5'. One plurality of spacer elements 5 is arranged between the first surface 31 of the cooling element 3 and the first surface 21 of the luminescent element 2 and another plurality of spacer elements 5' is arranged between the first surface 31' of the cooling element 3' and the second surface 22 of the luminescent element 2. Hence, the cooling element 3' is arranged spaced apart from the second surface 22 of the luminescent element 2 with a distance d' corresponding to the distance d between the cooling element 2 and the luminescent element 2.

Irrespective of the embodiment, the spacer elements 5, 50, and the spacer elements 5', 50' where provided, may be surface structures, such as protrusions, provided on the cooling element 3, 30 or 3', 30' or they may be separate spacer elements. It is noted that the spacer elements are not limited to the very schematic structures shown in the Figures.

Analogously to the embodiment shown in FIG. 1, the force F forcing the cooling element 3' and the luminescent element 2 together is obtained by providing the cooling element 3' as a cooling element or cooling plate in the form of a fluid container 3' with thin walls 31', 32' and comprising a heat pipe 4'. The medium within the fluid container 3' is under a predetermined pressure creating an outwards directed force F. The resulting force F on the wall 31' presses the wall 31' smoothly against the luminescent rod 2.

Figure 3:
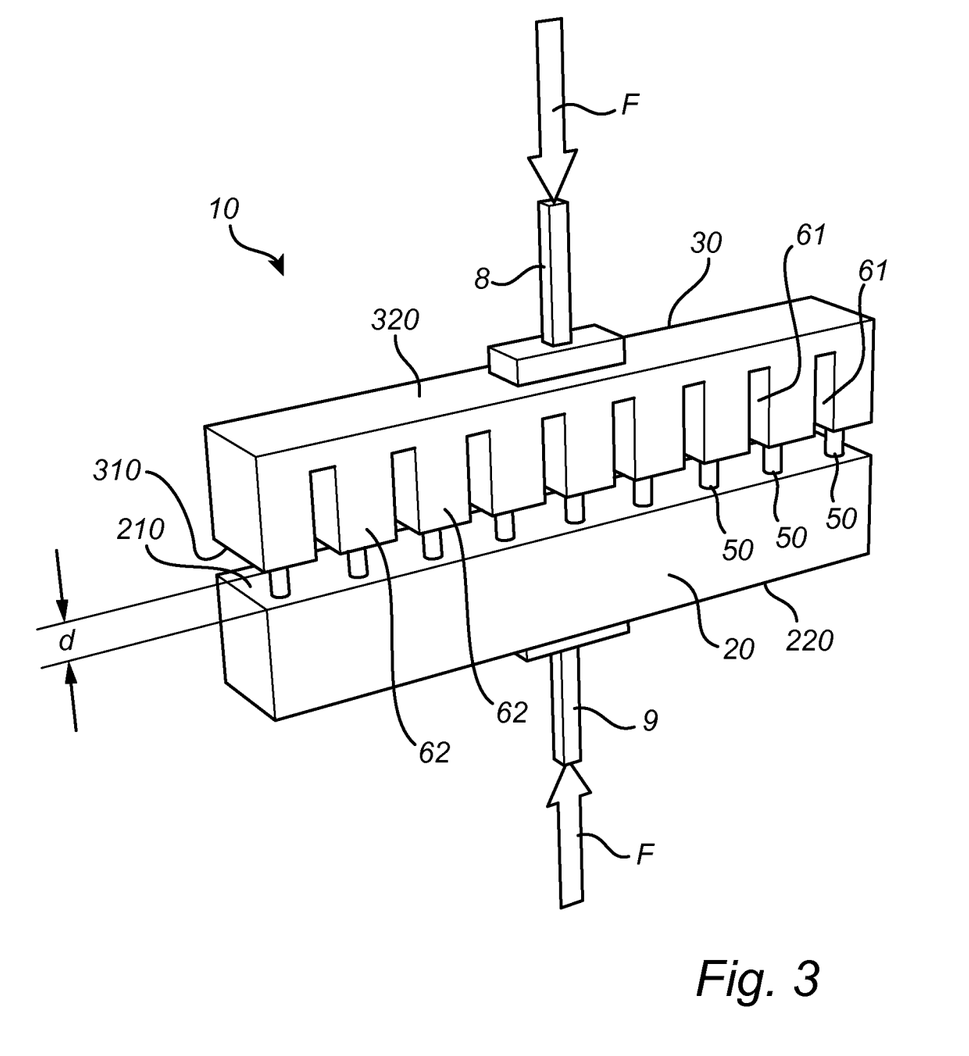
FIG. 3 shows a perspective view of a second embodiment of a light emitting device according to the invention and comprising a luminescent element and one cooling element.

Turning now to FIG. 3 a perspective view of a second embodiment of a light emitting device 10 according to the invention and comprising a luminescent element 20 and a cooling element 30 is shown. A plurality of spacer elements 50 are provided and arranged between the surface 310 of the cooling element 30 and the first surface 210 of the luminescent element 20 such that the cooling element 30 is arranged spaced apart from the first surface 210 of the luminescent element 20 with the distance, d.

The cooling element 30 is on the surface 310 provided with a plurality of fins 62 and slits 61 being arranged in an alternating order. The plurality of fins 62 and slits 61 make the cooling element 30 compliant. The cooling element 30 is therefore adapted for following the actual warpage of the luminescent element 20, and in particular the warpage induced in the luminescent element 20 by light and/or heat propagating within the luminescent element 20. Thereby no part of the cooling element 30 and the luminescent element 20 are in mutual contact at any time. Furthermore, a force, F, indicated by means of arrows in FIG. 3 is applied to the light emitting device 10 in such a direction that the at least one cooling element 30 and the luminescent element 20 are forced together.

In the embodiment shown in FIG. 3 the force F is obtained by providing the light emitting device with a force application device in the form of a very schematically illustrated clamp 8, 9. The force F created by the part 8 of the clamp 8, 9 on the wall 320 of the cooling element and the force F created by the part 9 of the clamp 8, 9 on the surface 220 of the luminescent element 20 presses the surface 310 smoothly against the luminescent rod 20.

The force is preferably applied as a plurality of fractions of the total force, by a plurality of elastic elements such as springs. This could by way of example be implemented as a stack or tree of cantilevers, a set of leaf springs or a set of helical springs. These forces should be distributed over the whole surface area, such as to ensure that the warpage of the luminescent element will be followed.

Figure 4:
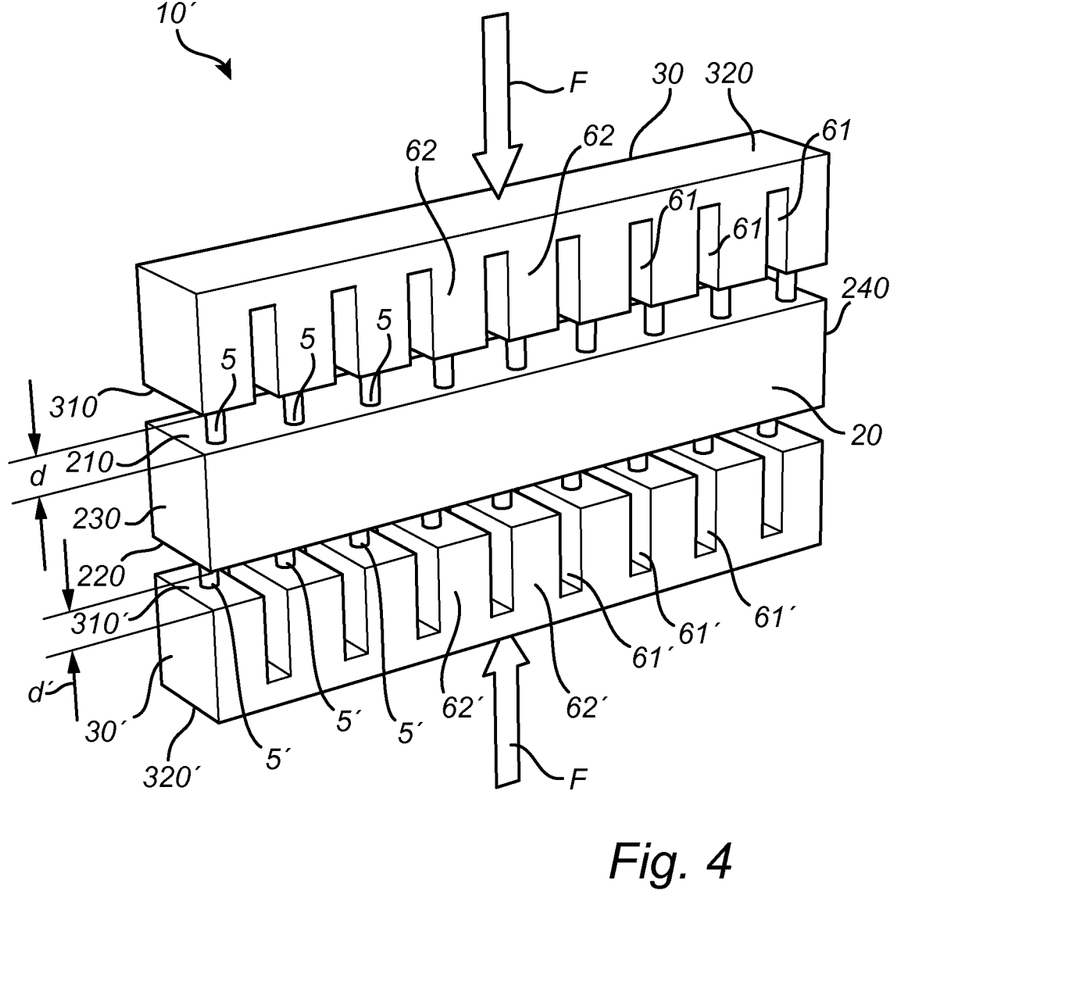
FIG. 4 shows a perspective view of the light emitting device according to FIG. 3 and comprising two cooling elements arranged at mutually opposite surfaces of the luminescent element.

FIG. 4 shows a perspective view of a light emitting device 10', which differs from the light emitting device 10 according to FIG. 3 only in comprising two cooling elements 30 and 30' arranged at mutually opposite surfaces 210 and 220 of the luminescent element 20 as well as two pluralities of spacer elements 5 and 5'. One plurality of spacer elements 5 is arranged between the first surface 310 of the cooling element 30 and the first surface 210 of the luminescent element 20 and another plurality of spacer elements 5' is arranged between the first surface 310' of the cooling element 30' and the second surface 220 of the luminescent element 20. Hence, the cooling element 30' is arranged spaced apart from the second surface 220 of the luminescent element 20 with a distance d' corresponding to the distance d between the cooling element 20 and the luminescent element 20.

Analogously to the embodiment shown in FIG. 3, the force F forcing the cooling element 3' and the luminescent element 2 together is obtained by providing the light emitting device with a force application device which for simplicity is not shown in FIG. 4. The force F created by the part of the force application device arranged on the wall 320 of the cooling element 30 and the force F created by the other part of the force application device being on the surface 320' of the cooling element 30' presses the respective walls 310 and 310' of the respective cooling elements 30 and 30' smoothly against the opposite surfaces 210 and 220 of the luminescent rod 20.

Furthermore, in embodiments with a luminescent element 2 or 20 and two oppositely arranged cooling elements 3 and 3' or 30 and 30' as shown in FIGS. 2 and 4, respectively, due to the thermal cycling the luminescent element has a tendency to move out of the position between the cooling elements due to a small force (not illustrated) acting on one of the end surfaces 23, 24 or 230, 240 (FIGS. 2 and 4, respectively) of the luminescent element in a direction perpendicular or almost perpendicular to the force F and further due to the presence of micro/macro slip at the interface of the luminescent element and the cooling elements. The micro/macro slip also causes uptake of metal particles onto the surface of the cooling elements and/or scratches in these surfaces, causing an efficiency drop due to light absorption and light out-coupling, respectively. The surfaces of the interface between cooling element and luminescent element should therefore be smooth and hard to prevent these effects.

In other words it is desired to provide the surfaces of the cooling elements at said interface with a certain value of the arithmetical mean roughness, $R_a$, where the arithmetical mean roughness is given as:

$$R_a = \Sigma_{i=1}^n |y_i|,$$

where the sampled roughness profile contains n ordered, equally spaced points along the trace, and $y_i$ is the vertical distance from the mean line of the sampled roughness profile to the $i^{th}$ data point. It has been shown by the inventor, that the contradictory optimal surface area for heat transfer versus light out-coupling in a light emitting device according to the invention has a trade-off point around $R_a$ 0.8.

A process for obtaining such an interface and the result thereof will be described further below with reference to FIGS. 6-8.

Figure 5:
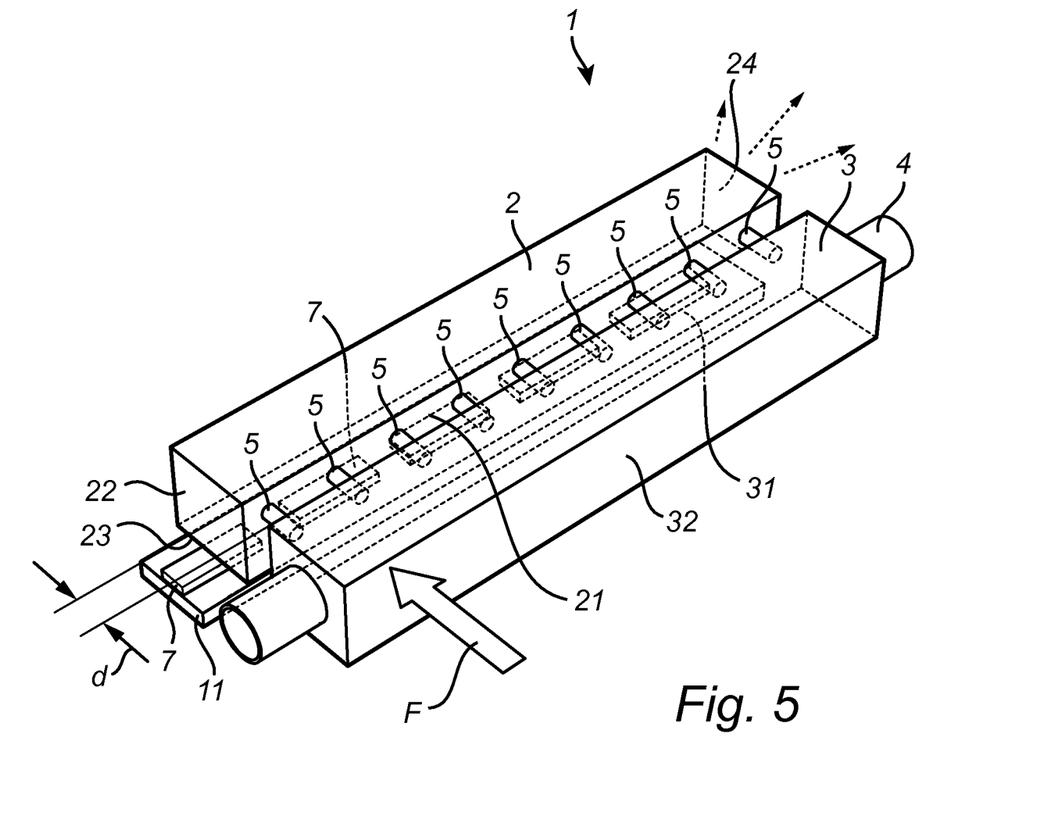
FIG. 5 shows a light emitting device according to FIG. 1 and further comprising a plurality of LEDs arranged at a light input surface of a luminescent element of the light emitting device.

Finally, FIG. 5 shows a light emitting device 1 of the type shown in FIG. 1 and further comprising a plurality of LEDs 7 adapted for, in operation, emitting first light with a first spectral distribution. The LEDs 7 are arranged at or on a light input surface 23 of the luminescent element 2. The LEDs 7 may furthermore be arranged on an optional substrate 11, such as a printed circuit board.

The luminescent element 2 is adapted for receiving the first light with the first spectral distribution emitted by the LEDs 7 at the light input surface 23, converting at least a part of the first light with the first spectral distribution to second light with a second spectral distribution, guiding the second light to a light exit surface 24 and coupling the second light with the second spectral distribution out of the light exit surface 24.

Figure 6:
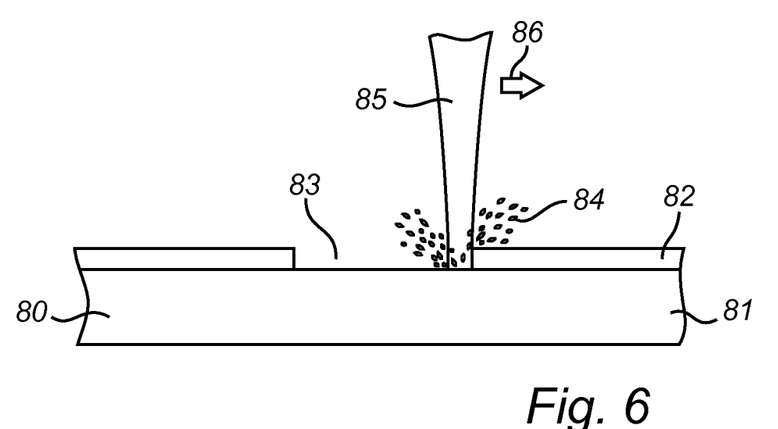
FIG. 6 schematically illustrates the steps of a process employing anodizing followed by laser ablation to provide spacer elements between a luminescent element and a cooling element of a light emitting device according to the invention.
Figure 7:
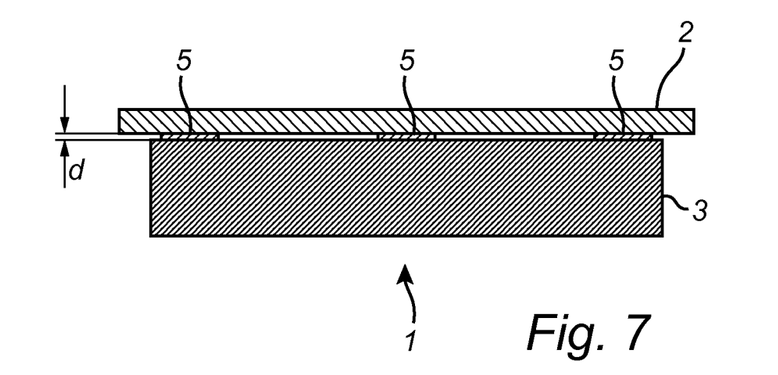
FIG. 7 shows a schematic side view of a light emitting device according to the invention obtained by means of a process as illustrated in FIG. 6.
Figure 8:
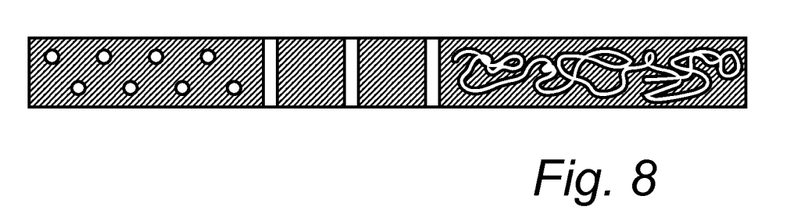
FIG. 8 illustrates different patterns which may be created by laser ablation in a process as illustrated in FIG. 6.

FIG. 6 schematically illustrates the steps of a process employing anodizing followed by engraving, here in the form of laser ablation, to provide smooth and hard surfaces on the interface between a luminescent element 2 (FIG. 7) and a cooling element 3 (FIG. 7) of a light emitting device according to the invention and at the same time provide the spacer elements 5 (FIG. 7).

The aim of such a process is to create a distance between the luminescent element and the cooling element by growing a coating layer 82, such as an oxide layer, on a base layer 81 of a work piece 80 i.e. anodization, and subsequently partly removing the coating layer 82 by means of laser ablation using a laser beam 85 moved in a working direction (arrow 86) to remove parts 84 of the coating layer 82 thereby creating markings 83. Referring also to FIG. 7, illustrating a result of the above-described process, the remaining parts of the coating layer 82 will thereby form spacer elements 5 thus obtaining the desired distance d between the luminescent element 2 and the cooling element 3. A further possibility is to also add a coating layer, such as an oxide layer, after laser ablation or engraving.

Ablation and engraving can be performed on virtually all materials, including metals, plastics and ceramics. For both processes, short, powerful laser pulses are used. The power densities are so high that the base material or coating decomposes or melts and evaporates, leaving behind the desired marking. The marking depth that can be achieved with engraving depends on how the work piece material absorbs the laser, how much energy the laser has, and how long the laser can dwell on the target. To prevent blackening by "soot" particles, no colorants should be added during anodization.

Any type of structure can be produced by means of a process as illustrated in FIG. 6 and described above. Examples are shown in FIG. 8, in which the white areas are the parts where the coating layer or oxide layer remains and by way of example form, from left to right on FIG. 8, dots, dashes and a random pattern, respectively.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting device comprising:
a luminescent element comprising a first surface,
at least one cooling element arranged at the first surface of the luminescent element, and
a plurality of spacer elements arranged between the cooling element and the first surface of the luminescent element such that the cooling element is arranged spaced apart from the first surface of the luminescent element with a distance d, wherein
the at least one cooling element comprises a compliance such as to be adapted for following warpage of the luminescent element, and wherein
a force (F) is applied to force the at least one cooling element and the luminescent element together in such a way that no part of the at least one cooling element and the luminescent element are in direct mutual contact,
the light emitting device further comprising a force application device adapted for applying the force applied to force the at least one cooling element and the luminescent element together.

2. A light emitting device according to claim 1, wherein only a part of the at least one cooling element facing the luminescent element comprises the compliance such that the cooling element is adapted for following warpage of the luminescent element induced by light and/or heat propagating within the luminescent element in such a way that no part of the at least one cooling element and the luminescent element are in mutual contact.

3. A light emitting device according to claim 1, wherein the plurality of spacer elements is one of surface structures provided on the at least one cooling element and separate spacer elements.

4. A light emitting device according to claim 1, wherein the plurality of spacer elements are beads in the form of nanospheres.

5. A light emitting device according to claim 4, wherein the nanospheres are $TiO_2$ nanospheres, $Al_2O_3$ nanospheres, silica nanospheres, monodisperse silica nanospheres or silver coated nanospheres.

6. A light emitting device according to claim 1, wherein the cooling element comprises a plurality of indents adapted for providing surface structures in the form of protrusions forming the plurality of spacer elements on the cooling element.

7. A light emitting device according to claim 1, wherein the minimal density of the plurality of spacer elements is chosen in dependence of the compliance of the at least one cooling element in such a way that no part of the at least one cooling element and the luminescent element are in mutual contact.

8. A light emitting device according to claim 1, wherein the maximal density of the plurality of spacer elements is chosen in dependence of the amount of light loss inflicted by the spacer elements.

9. A light emitting device according to claim 1, wherein the spacer elements are distributed regularly over the first surface of the luminescent element.

10. A light emitting device according to claim 1, wherein the spacer elements are provided on the cooling element by means of wet-spraying, semi-wet-spraying, dry-spraying, wet etching, dry etching or anodizing followed by laser ablation or engraving.

11. A light emitting device according to claim 1, wherein the distance d, with which the cooling element is arranged spaced apart from the first surface of the luminescent element is uniform over the extension of the first surface of the luminescent element, and/or wherein the distance d, with which the cooling element is arranged spaced apart from the first surface of the luminescent element is any one of more than 1 μm and less than 10 μm and more than 1 μm and less than 5 μm.

12. A light emitting device according to claim 1, wherein the at least one cooling element is any one of:
a hollow cooling element comprising walls adapted to provide the compliance of the cooling element, the hollow cooling element being filled with a fluid, the fluid being under a pressure such as to provide the force applied to force the at least one cooling element and the luminescent element together, and
a cooling element comprising slits or fins, the number and density of the slits or fins being chosen such as to provide the compliance of the cooling element.

13. A light emitting device according to claim 1, wherein the light emitting device comprises a further cooling element arranged at a second surface of the luminescent element opposite to the first surface of the luminescent element, and
a further plurality of spacer elements arranged between the further cooling element and the second surface of the luminescent element such that the further cooling element is arranged spaced apart from the second surface of the luminescent element with a distance d',
the further cooling element comprising a compliance such as to be adapted for following warpage of the luminescent element, and
a force (F) being applied to force the further cooling element and the luminescent element together in such a way that no part of the at least one cooling element and the luminescent element are in direct mutual contact.

14. A light emitting device according to claim 1, and further comprising:
a plurality of LEDs adapted for, in operation, emitting first light with a first spectral distribution, and being arranged at or on a light input surface of the luminescent element,
the luminescent element being adapted for receiving the first light with the first spectral distribution at the light input surface, converting at least a part of the first light with the first spectral distribution to second light with a second spectral distribution, guiding the second light to a light exit surface and coupling the second light with the second spectral distribution out of the light exit surface.

15. A lighting device or a luminaire comprising a light emitting device according to claim 1.

* * * * *